(12) United States Patent
Hsu

(10) Patent No.: US 7,079,402 B2
(45) Date of Patent: Jul. 18, 2006

(54) MODULARIZED CIRCUIT BOARD MOUNTING ARCHITECTURE

(75) Inventor: Cheng-Chung Hsu, Taipei (TW)

(73) Assignee: Inventec Corporation, Taipei (TW)

( * ) Notice: Subject to any disclaimer, the term of this patent is extended or adjusted under 35 U.S.C. 154(b) by 280 days.

(21) Appl. No.: 10/681,992

(22) Filed: Oct. 8, 2003

(65) Prior Publication Data
US 2005/0078466 A1    Apr. 14, 2005

(51) Int. Cl.
*H05K 7/14* (2006.01)

(52) U.S. Cl. .................................. 361/801
(58) Field of Classification Search ............ 361/801, 361/683, 686, 684, 732, 725, 726, 727, 747, 361/809
See application file for complete search history.

(56) References Cited

U.S. PATENT DOCUMENTS 6,056,579 A * 5/2000 Richards et al. .......... 439/358
6,442,020 B1 * 8/2002 Liu et al. .................. 361/683
6,636,422 B1 * 10/2003 Tanzer et al. .............. 361/687

* cited by examiner

Primary Examiner—Kamand Cuneo
Assistant Examiner—Ivan Carpio
(74) Attorney, Agent, or Firm—Fulbright & Jaworski L.L.P.

(57) ABSTRACT

A modularized circuit board mounting architecture is proposed, which is designed for use to mount a modularized circuit board onto the inside of an enclosure, such as a server's chassis or a desktop computer's casing. The proposed mounting architecture is more advantageous to use that prior art in that the mounting and dismounting of the modularized circuit board to and from the enclosure can be both carried out effortlessly simply by hand without requiring technical personnel or user to use any assisting tools, such as screw drivers. This feature allows computer manufacturers to assembly computer units more quickly and efficiently and thereby significantly reduce labor hours. Moreover, it also allows after-sale maintenance or upgrade to be carried out more quickly and efficiently.

5 Claims, 4 Drawing Sheets

MODULARIZED CIRCUIT BOARD MOUNTING ARCHITECTURE

BACKGROUND OF THE INVENTION

1. Field of the Invention

This invention relates to assembly technology for electronic and computer products, and more particularly, to a modularized circuit board mounting architecture, which is designed for use to mount a modularized circuit board, such as an expansion card for network servers or desktop computers, onto the inside of an enclosure, such as a server's chassis or a desktop computer's casing, and which is characterized by that the mounting and dismounting of the modularized circuit board to and from the enclosure can be both carried out effortlessly simply by hand without requiring technical personnel or user to use any assisting tools, such as screw drivers.

2. Description of Related Art

Modern assembly technologies for electronic and computer products is based on the concept of modularized design for all the functional units of an electronic or computer system, such as a modularized design for circuit boards or hard disk drives, so that these modularized circuit boards or devices can be easily assembled to build a large computer system, or later integrated to the computer system to increase the functionality thereof.

Conventionally, a traditional way to integrate a modularized circuit board to a computer system, such as a network server or a desktop computer, is to use screws to fixedly secure the circuit board on the inside of the enclosure of the computer system. One drawback to this practice, however, is that the technical personnel or user must use screw drivers or similar assisting tools to fasten the screws during the mounting process; and thereafter when it is needed to remove the circuit board from the enclosure, it also requires the use of screw drivers to unfasten the screws to dismount the circuit board. This practice is undoubtedly quite laborious and time-consuming, which makes the mounting or dismounting of the circuit board quite inefficiently.

SUMMARY OF THE INVENTION

It is therefore an objective of this invention to provide a modularized circuit board mounting architecture which allows the mounting and dismounting of a modularized circuit board to and from an enclosure to be carried out effortlessly simply by hand without requiring technical personnel or user to use any assisting tools, such as screw drivers.

The modularized circuit board mounting architecture according to the invention is characterized by the use of a handle-equipped locking member, which is securely fixed to one edge of the substrate, and which includes an elongated elastic portion and a ring-shaped handle portion; and the elongated elastic portion includes a front-end pivot portion, a middle-section hook portion, and a rear-end press-on portion. Furthermore, the modularized circuit board mounting architecture of the invention includes a fixation structure provided on the enclosure, which includes a guide structure and a supportive panel, where the guide structure is used during the assembly to guide the circuit board into intended position on the inside of the enclosure and provide an under support for the circuit board when the circuit board is mounted in position. The supportive panel is formed with a locking hole corresponding to the middle-section hook portion of the elongated elastic portion on the handle-equipped locking member.

During mounting when the modularized circuit board is mounted in position inside the enclosure, the hook portion of the elongated elastic portion on the handle-equipped locking member is hooked in the locking hole in the supportive panel on the enclosure, allowing the stopper surface to stop the modularized circuit board from being withdrawable and securely fix the modularized circuit board in position on the inside of the enclosure. Thereafter, whenever it is needed to remove the circuit board from the enclosure, the technical personnel or user simply needs to use his/her thumb to press on the rear-end press-on portion of the elongated elastic portion on the handle-equipped locking member to release the hook portion from the locking hole and then use his/her index or middle finger to withdraw the circuit board from the enclosure.

The modularized circuit board mounting architecture according to the invention is more advantageous to use that prior art in that the mounting and dismounting of the modularized circuit board to and from the enclosure can be both carried out effortlessly simply by hand without requiring technical personnel or user to use any assisting tools, such as screw drivers. This feature allows computer manufacturers to assembly computer units more quickly and efficiently and thereby significantly reduce the required labor hours for the assembly work, so that the invention is particularly useful in assembly factories located in those countries where average wage per hour is high, such as the United States or some European countries. Moreover, the invention also allows after-sale maintenance or upgrade to be also carried out more quickly and efficiently.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The modularized circuit board mounting architecture according to the invention is disclosed in full details by way of preferred embodiments in the following with reference to the accompanying drawings.

Figure 1:
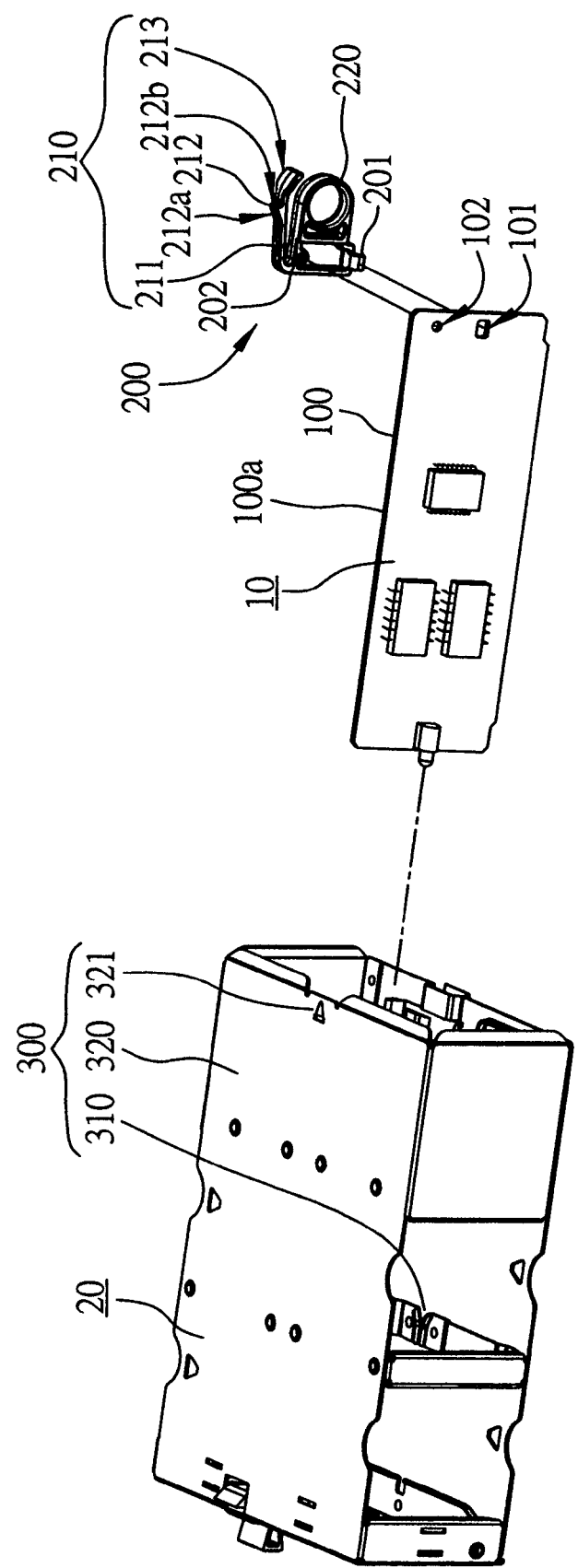
FIG. 1 is a schematic diagram showing an exploded perspective view of the modularized circuit board mounting architecture of the invention before being used to mount a modularized circuit board to an enclosure.

As shown in FIG. 1, the modularized circuit board mounting architecture of the invention is designed for use to mount a modularized circuit board 10, such as an expansion card for network servers or desktop computers, to the inside of an enclosure 20, such as a server's chassis or a desktop computer's casing. In the assembly process, the first step is to prepare a substrate 100 and a specially-designed handle-equipped locking member 200.

The substrate 100 is used to accommodate the circuitry of the modularized circuit board 10, i.e., various electronic components such as integrated circuit devices. In addition, in order to allow the handle-equipped locking member 200 to be securely attached to the circuit board 10, the substrate 100 has one side 100a (i.e., the external side of the substrate 100) formed with at least one engagement hole 101 and a bolting hole 102.

The handle-equipped locking member 200 is a specially-designed mechanical component, which should be made of an elastic material, such as plastics. In structure, the handle-equipped locking member 200 is formed with a tongue portion 201 and a bolting hole 202 corresponding respectively to the engagement hole 101 and the bolting hole 102 in the substrate 100. In addition, the handle-equipped locking member 200 further includes an elongated elastic portion 210 and a ring-shaped handle portion 220. The elongated elastic portion 210 includes a front-end pivot portion 211, a middle-section hook portion 212, and a rear-end press-on portion 213; and wherein the middle-section hook portion 212 includes a sliding surface 212a and a stopper surface 212b. When the rear-end press-on portion 213 is pressed by a human's finger, it can cause the elongated elastic portion 210 to be pivotally pressed down about the pivot portion 211.

Furthermore, the modularized circuit board mounting architecture of the invention includes a fixation structure 300 provided on the enclosure 20, which includes a guide structure 310 and a supportive panel 320. The guide structure 310 is used during the mounting process to guide the circuit board 10 into intended position on the inside of the enclosure 20 and to provide an under fixation support for the circuit board 10 when the circuit board 10 is mounted in position. The supportive panel 320 can be either an integral part of the enclosure 20 or an added piece of plate to the enclosure 20, and which is formed with a locking hole 321 corresponding to the hook portion 212 of the elongated elastic portion 210 on the handle-equipped locking member 200.

Figure 2:
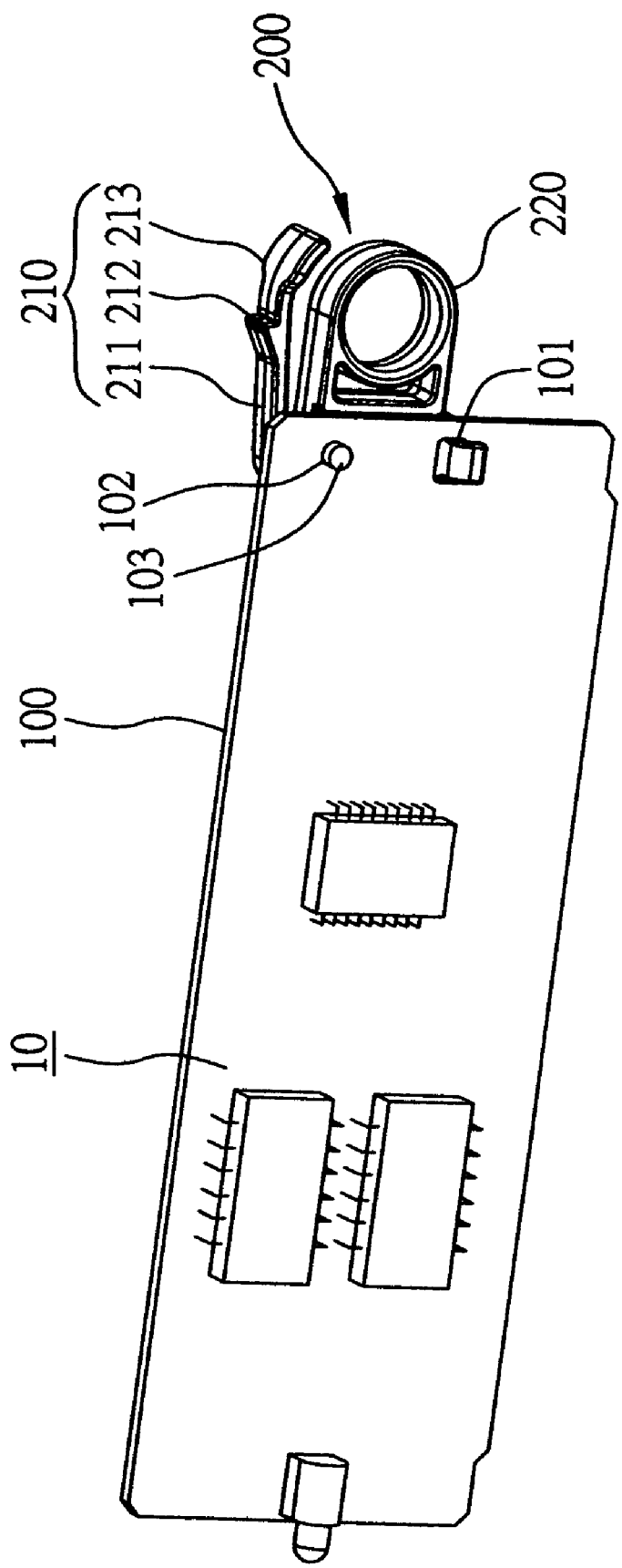
FIG. 2 is a schematic diagram showing a perspective view of the attachment of a handle-equipped locking member to the modularized circuit board.

Referring next to FIG. 2, during the assembly process, the first step is to securely attach the handle-equipped locking member 200 to the external side 100a of substrate 100 by first engaging the tongue portion 201 of the handle-equipped locking member 200 to the engagement hole 101 in the substrate 100, and then using bolting means 103 (i.e., a bolt and a nut) to insert through the bolting hole 202 in the handle-equipped locking member 200 and the bolting hole 102 in the substrate 100 to fasten the handle-equipped locking member 200 securely on the external side 100a of substrate 100.

Figure 3:
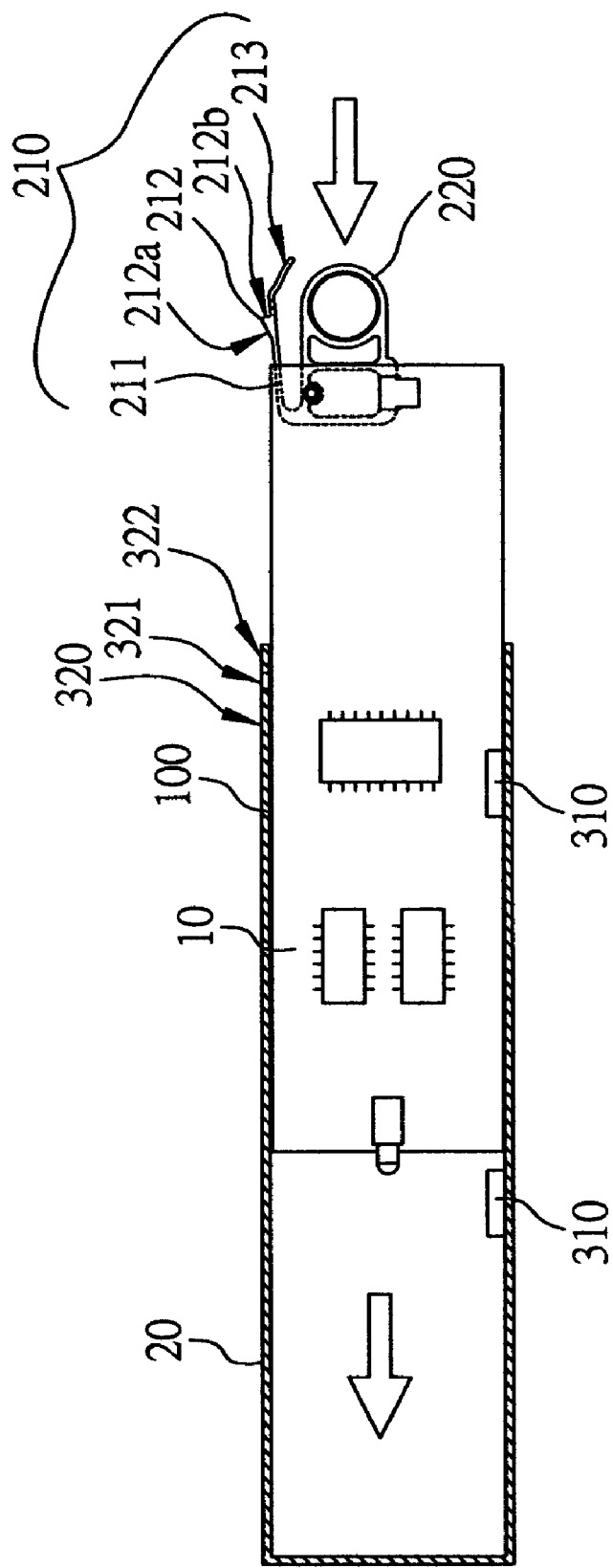
FIG. 3 is a schematic diagram showing a sectional view of the mounting of the modularized circuit board onto the inside of the enclosure.

Referring further to FIG. 3, during the mounting of the circuit board 10 to the enclosure 20, the first step is to manually align (by technical personnel or user) the circuit board 10 against the guide structure 310 in the enclosure 20, and then push forcibly by hand against the handle portion 220 of the handle-equipped locking member 200 to force the circuit board 10 to move along the guide structure 310 toward the inside of the enclosure 20. During the course of the movement of the circuit board 10, the sliding surface 212a of the hook portion 212 of the elongated elastic portion 210 will encounter the external edge 322 of the supportive panel 320. Due to the elasticity of the elongated elastic portion 210, the hook portion 212 will be urged downwards below the external edge 322 of the supportive panel 320 and thus allow the circuit board 10 to move on to the inside of the enclosure 20 without being impeded in motion.

Figure 4:
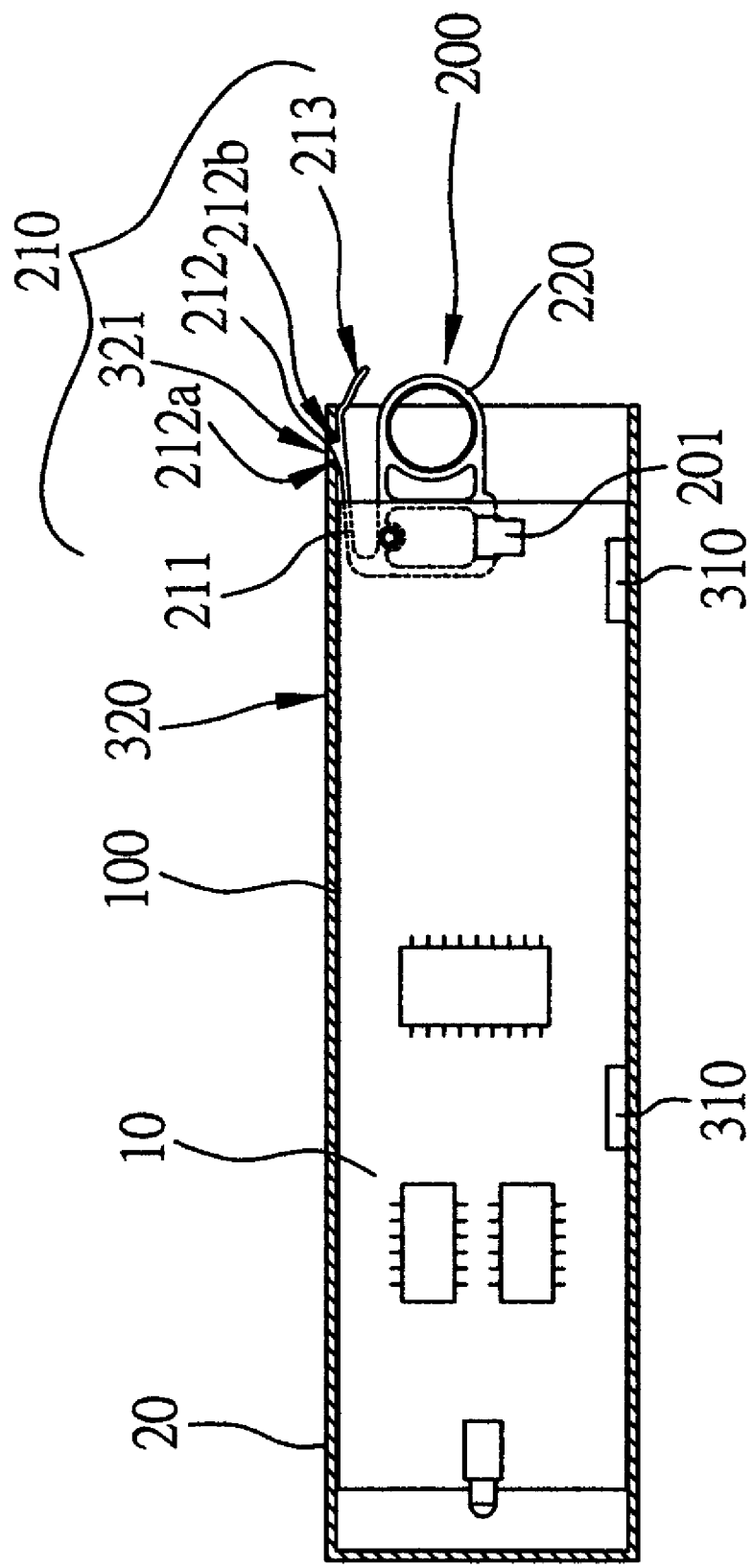
FIG. 4 is a schematic diagram showing a sectional view of the finished assembly of the modularized circuit board on the inside the enclosure by means of the modularized circuit board mounting architecture of the invention.

Referring finally to FIG. 4, when the circuit board 10 reaches its intended position, the hook portion 212 of the handle-equipped locking member 200 is precisely aligned to the locking hole 321 in the supportive panel 320, which allows the hook portion 212 to flip upwards into the locking hole 321 due to its elastic restoration. This causes the stopper surface 212b to abut against the inner wall of the locking hole 321, thus stopping the circuit board 10 from being withdrawable from the enclosure 20 and secure the circuit board 10 in position on the inside of the enclosure 20. This completes the assembly of the modularized circuit board 10 to the inside of the enclosure 20.

Thereafter, whenever it is needed to remove the circuit board 10 from the enclosure 20, the technical personnel or user simply needs to use his/her thumb to press on the rear-end press-on portion 213 of the elongated elastic portion 210 on the handle-equipped locking member 200 and then use his/her index or middle finger to pull against the handle portion 220 of the handle-equipped locking member 200. This action will cause the hook portion 212 of the handle-equipped locking member 200 to be released from the locking hole 321, thus allowing the modularized circuit board 10 to be withdrawable from the enclosure 20 by pulling the ring-shaped handle portion 220.

In conclusion, the invention provides a modularized circuit board mounting architecture which is designed for use to mount a modularized circuit board to the inside of an enclosure, and which is more advantageous to use that prior art in that the mounting and dismounting of the modularized circuit board to and from the enclosure can be both carried out effortlessly simply by hand without requiring technical personnel or user to use any assisting tools, such as screw drivers. This feature allows computer manufacturers to assembly computer units more quickly and efficiently and thereby significantly reduce the required labor hours for the assembly work. Moreover, it also allows after-sale maintenance or upgrade to be carried out more quickly and efficiently. The invention is therefore more advantageous to use than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A modularized circuit board mounting architecture for mounting a modularized circuit board to an enclosure, which comprises:

a substrate, which is used to accommodate the circuitry of the modularized circuit board;

a handle-equipped locking member, which is securely attached to one edge of the substrate, and which is formed with an elongated elastic portion and a ring-shaped handle portion, where the elongated elastic portion further includes a front-end pivot portion, a middle-section hook portion, and a rear-end press-on portion, and the hook portion further includes a sliding surface and a stopper surface; wherein when the rear-end press-on portion is pressed on, it causes the elongated elastic portion to be pivotally pressed down about the pivot portion; and a fixation structure, which is provided on the enclosure, and which includes a guide structure and a supportive panel, where the supportive panel is formed with at least one locking hole corresponding to the hook portion of the elongated elastic portion on the handle-equipped locking member; wherein when the modularized circuit board is mounted in position inside the enclosure, the hook portion of the elongated elastic portion on the handle-equipped locking member is hooked in the locking hole in the supportive panel on the enclosure, allowing the stopper surface to stop the modularized circuit board from being withdrawable and securely fix the modularized circuit board in position on the inside of the enclosure; and wherein when the rear-end press-on portion of the elongated elastic portion on the handle-equipped locking member is pressed and the ring-shaped handle portion is pulled, the hook portion of the elongated elastic portion is urged to be released from the locking hole, allowing the modularized circuit board to be manually withdrawable from the enclosure by means of the ring-shaped handle portion.

2. The modularized circuit board mounting architecture of claim 1, wherein the modularized circuit board is an expansion card for a network server, and the enclosure is the network server's chassis.

3. The modularized circuit board mounting architecture of claim 1, wherein the modularized circuit board is an expansion card for a desktop computer, and the enclosure is the desktop computer's casing.

4. The modularized circuit board mounting architecture of claim 1, wherein the handle-equipped locking member is securely attached to the substrate by means of a fastening architecture which includes the forming of at least one engagement hole and at least one bolting hole in the substrate and the forming of at least one tongue portion and at least one bolting hole in the handle-equipped locking member; wherein the tongue portion of the handle-equipped locking member is engaged to the engagement hole in the substrate, and bolting means is inserted through the bolting hole in the handle-equipped locking member and the bolting hole in the substrate to fasten the handle-equipped locking member on the substrate.

5. The modularized circuit board mounting architecture of claim 1, wherein the elongated elastic portion of the handle-equipped locking member is made of plastic.

* * * * *